United States Patent [19]
Deisch

[11] Patent Number: 6,072,340
[45] Date of Patent: *Jun. 6, 2000

[54] PULSE SHAPING AND FILTERING CIRCUIT FOR DIGITAL PULSE DATA TRANSMISSIONS

[75] Inventor: Cecil W. Deisch, Warrenville, Ill.

[73] Assignee: Tellabs Operations, Inc., Lisle, Ill.

[*] Notice: This patent issued on a continued prosecution application filed under 37 CFR 1.53(d), and is subject to the twenty year patent term provisions of 35 U.S.C. 154(a)(2).

[21] Appl. No.: 08/823,189

[22] Filed: Mar. 24, 1997

[51] Int. Cl.⁷ .............................. H03M 1/76; H03K 5/00
[52] U.S. Cl. ..................... 327/100; 327/558; 327/129; 327/344; 327/552; 327/311; 341/153
[58] Field of Search .................... 327/100, 552, 327/553, 558, 311, 129, 344; 341/153

[56] References Cited

U.S. PATENT DOCUMENTS

| | | | |
|---|---|---|---|
| 4,339,724 | 7/1982 | Feher | 327/170 |
| 4,598,267 | 7/1986 | Fukuda | 341/106 |
| 4,773,082 | 9/1988 | Somer et al. | 375/60 |
| 4,816,830 | 3/1989 | Cooper | 327/100 |
| 4,876,615 | 10/1989 | Chikashige | 360/43 |
| 4,968,898 | 11/1990 | Hushimi et al. | 327/100 |
| 5,119,326 | 6/1992 | Cochran et al. | 708/819 |
| 5,148,383 | 9/1992 | Jaeger | 708/319 |
| 5,166,836 | 11/1992 | Choi | 360/41 |
| 5,253,272 | 10/1993 | Jaeger et al. | 375/60 |
| 5,313,494 | 5/1994 | Park et al. | 341/68 |

*Primary Examiner*—Dinh T. Le
*Attorney, Agent, or Firm*—McAndrews, Held & Malloy, Ltd.

[57] ABSTRACT

A signal shaping circuit for shaping amplitude shift keyed digital pulses of a digital data stream is set forth. The digital data stream is comprised of a plurality of symbols from which the signal shaping circuit generates an output signal having sinusoidally shaped transition regions between logic level transitions of the digital data stream. The signal shaping circuit comprises an input lead receiving each of the digital pulses of the digital data stream. A delay circuit receives each of the digital pulses of the digital data stream at the input lead and, after a predefined time delay, outputs delayed digital pulses corresponding to each of the digital pulses received at the input lead. A ringing filter circuit having a linear response receives each of the digital pulses of the digital data stream provided from the input lead and each of the digital pulses provided at the output of the delay circuit. The ringing filter circuit has a ringing period about equal to or less than twice the symbol period of the digital data stream which, in turn, sets the value of the predefined delay. More particularly, the predefined delay of the delay circuit is about equal to half of the ringing period. As a result, the ringing filter circuit generates an output amplitude shift keyed digital data stream directly corresponding to the digital data stream provided at the input lead which has sinusoidally shaped transition regions between its logic level transitions. The resulting waveform has a lower bandwidth than the corresponding input signal and, further, has no intersymbol interference associated with it.

10 Claims, 6 Drawing Sheets

PULSE SHAPING AND FILTERING CIRCUIT FOR DIGITAL PULSE DATA TRANSMISSIONS

CROSS-REFERENCE TO RELATED APPLICATIONS

Not Applicable

STATEMENT REGARDING FEDERALLY SPONSORED RESEARCH OR DEVELOPMENT

Not Applicable

BACKGROUND OF THE INVENTION

The present invention generally relates to the transmission of digital signals and more specifically to a circuit for shaping digital pulse data transmissions, such as non-return to zero (NRZ) type digital transmissions.

Digital data transmissions are often in the form of a series of transmitted pulses wherein each pulse is transmitted at an amplitude of one of at least two binary states. Such transmissions are often referred to as amplitude shift keyed transmissions and generally are associated with pulses that are transmitted with one of two amplitude levels.

Figure 1:
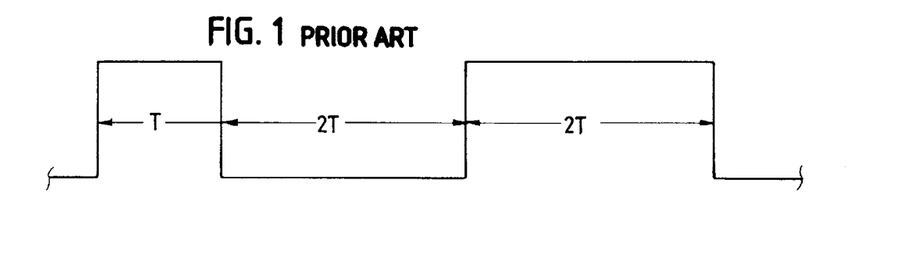
FIG. 1 illustrates an exemplary serial stream of amplitude shift keyed data pulses, such as found in an NRZ data transmission.

One example of a data transmission format for transmitting digital information is known as the non-return-to-zero (NRZ) format. The NRZ format is a binary amplitude shift keyed format. FIG. 1 illustrates an exemplary NRZ digital transmission comprising a plurality of serial data pulses or "symbols" 10, each of which has a symbol period or width T. Since the NRZ format is a binary data format, the data symbols 10 may have one of only two amplitude states.

Figure 2:
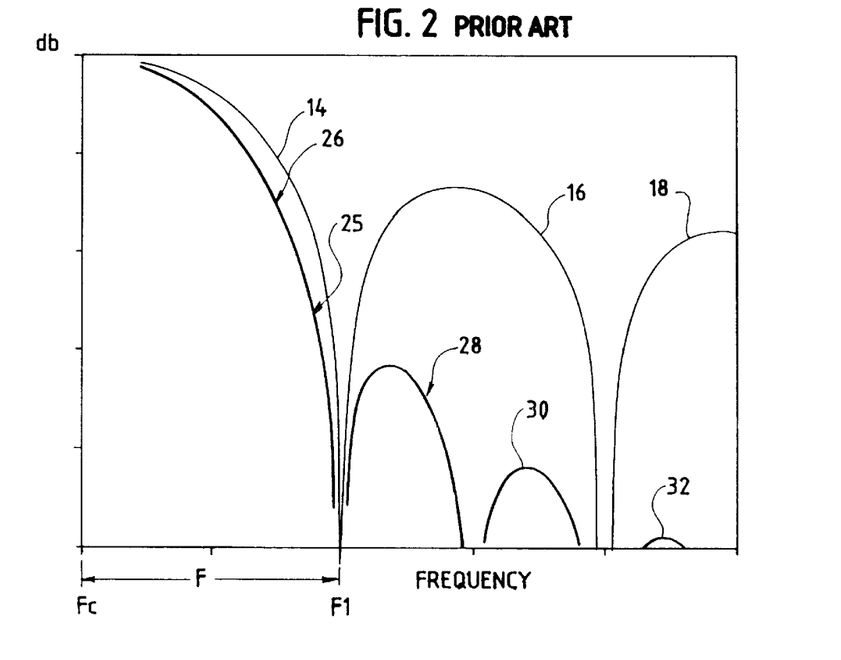
FIG. 2 illustrates a frequency spectrum associated with a pulse of the exemplary stream of data pulses illustrated in FIG. 1.

FIG. 2 illustrates the frequency spectrum of a single data pulse of the exemplary digital pulse transmission. As shown, the frequency spectrum is centered at a frequency $F_c$ which, for example, may be at baseband or at the frequency of a modulated carrier. The frequency spectrum includes a main lobe 14 followed by multiple side lobes, such as at 16 and 18, that decrease in magnitude along the frequency axis. The information carried by the digital data pulse is principally found in the main lobe 14 having a bandwidth f, where f equals 1/T, and where T equals the pulse width of a single symbol. It is therefore preferable to filter out the frequency components above the frequency f because the side lobes 16 and 18 above frequency f have substantial amplitudes and thus, contain a significant amount of high frequency energy. Consequently, complex, high order filters would nornally be required to filter out an acceptable amount of the high frequency energy. It is, however, undesirable to use complex filters.

Figure 3:
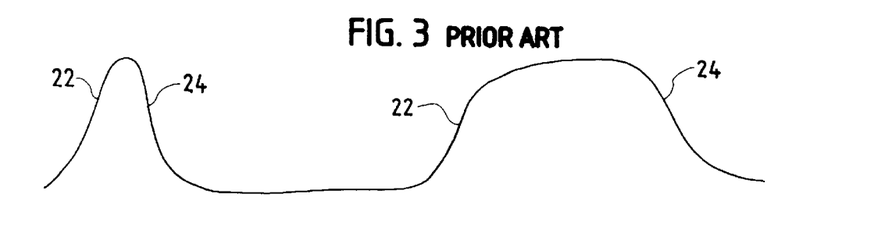
FIG. 3 illustrates an exemplary stream of smoothed amplitude shift keyed data pulses.

It has been proposed to "smooth" the waveform of an NRZ data pulse stream prior to transmission. As shown in FIG. 3, the NRZ digital data stream has been modified to include transition regions, such as 22 and 24, which are substantially sinusoidally shaped. FIG. 2 illustrates the frequency spectrum associated with a single pulse of the waveform of FIG. 3. As shown at 25 of FIG. 2, the frequency spectrum includes a main lobe 26 followed by side lobes 28, 30 and 32. The side lobes 28, 30 and 32 are significantly smaller in amplitude than the side lobes 16 and 18 associated with a non-smoothed NRZ data bit stream (FIG. 1). Consequently, a much simpler filter may be used to filter out signals at frequencies above frequency $F_1$ prior to transmission.

"Smoothing" of a digital data pulse transmission has several advantageous effects. First, the reduced bandwidth means that more such transmissions can be transmitted within a given allocated bandwidth. This, in turn, means that more intelligent information can be transmitted in a given bandwidth.

One system of note in connection with such an approach to digital data transmissions is set forth in U.S. Pat. No. 4,339,724 titled "Filter" by Dr. Kamilo Feher. The '724 patent seeks to prevent intersymbol interference and jitter, while reducing the bandwidth of the data signals. The '724 patent discloses a filter that includes an input for receiving a pulse type of input signal and for providing an output signal correlated to the input signal. The filter comprises means for comparing the output signal with the input signal and four waveform generators. The first waveform generator produces a first predetermined output signal waveform when the input and output signal amplitudes differ and the input signal equals a logical 1. The second waveform generator produces a second predetermined output signal waveform when the input and output signal amplitudes differ and the input signal equals a logical zero. The third waveform generator produces a third predetermined output signal waveform when the input and output signal amplitudes equal and the input signal equals a logical 1. The fourth waveform generator produces a fourth predetermined output signal waveform when the input and output signal amplitudes equal and the input signal equals a logical zero. The first through fourth waveform generators correspond to a sine wave generator, a cosine wave generator, a positive DC signal generator and a negative DC signal generator, respectively. Each signal generator is turned on and off by switches controlled by the aforementioned logic.

However, the filter of the '724 patent is unduly complex as it requires separate waveform generators to produce each desired segment of the output signal, along with a complex logic and switching network to analyze the input signal and turn on and off corresponding signal generators. The filter of the '724 patent draws a significant amount of power to drive the multiple waveform generators that construct the output signal.

BRIEF SUMMARY OF THE INVENTION

A signal shaping circuit for shaping amplitude shift keyed digital pulses of a digital data stream is set forth. The digital data stream is comprised of a plurality of symbols from which the signal shaping circuit generates an output signal having sinusoidally shaped transition regions between logic level transitions of the digital data stream. The signal shaping circuit comprises an input lead receiving each of the digital pulses of the digital data stream. A delay circuit receives each of the digital pulses of the digital data stream at the input lead and, after a predefined time delay, outputs delayed digital pulses corresponding to each of the digital pulses received at the input lead. A ringing filter circuit having a linear response receives each of the digital pulses of the digital data stream provided from the input lead and each of the digital pulses provided at the output of the delay circuit. The ringing filter circuit has a ringing period about equal to or less than twice the symbol period of the digital data stream which, in turn, sets the value of the predefined delay. More particularly, the predefined delay of the delay circuit is about equal to half of the ringing period. As a result, the ringing filter circuit generates an output amplitude shift keyed digital data stream directly corresponding to the digital data stream provided at the input lead which has sinusoidally shaped transition regions between its logic level transitions. The resulting waveform has a lower bandwidth than the corresponding input signal and, further, has no intersymbol interference associated with it.

The construction of the foregoing system may be extended to provide sinusoidal transitions to a multilevel, non-binary output data stream that is generated from a plurality of digital input data streams. Again, such a system provides an output signal having a lower bandwidth than the corresponding input signals and, further, has no intersymbol interference associated with it.

BRIEF DESCRIPTION OF THE DRAWINGS SEVERAL VIEWS OF THE DRAWINGS

DETAILED DESCRIPTION OF THE INVENTION

Prior to explanation of the preferred embodiments of the present invention, the following general explanation is provided to better illustrate the fundamentals upon which the subject invention is premised.

Figure 4:
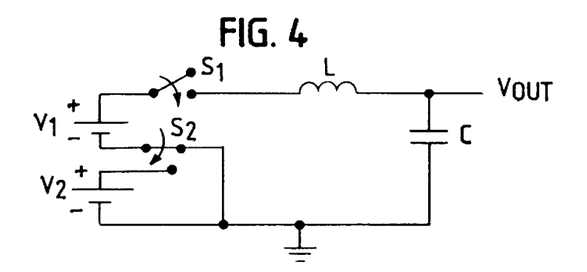
FIG. 4 is a schematic diagram of an ideal LC circuit used to illustrate some of the principles upon which the present invention is based.
Figure 5:
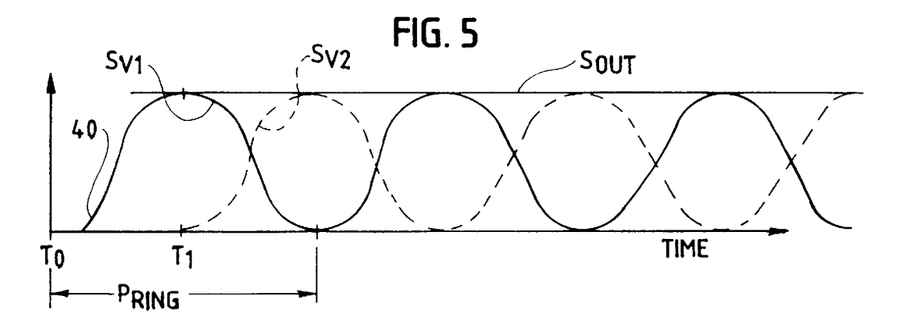
FIG. 5 illustrates component waveforms and a resultant composite signal generated by the circuit of FIG. 4.

FIG. 4 illustrates a circuit diagram of an ideal circuit including an inductor L connected in series with a capacitor C. Two voltage sources $V_1$ and $V_2$ are also provided in series with the inductor L and capacitor C. The first and second voltage sources $V_1$ and $V_2$ are equal step forcing functions (e.g., one volt sources). An output $V_{OUT}$ of the circuit of FIG. 4 is illustrated in FIG. 5. It is assumed that the initial current and voltages within the circuit of FIG. 4 are zero prior to a time $T_0$. At time $T_0$, switch $S_1$ is closed, thereby connecting the first voltage source $V_1$ in series with the inductor L and capacitor C. The negative terminal of the source $V_1$ is initially connected to ground through switch $S_2$. Then the switch $S_1$ is closed, a step voltage equal to $V_1$ is applied to the LC circuit which produces a first sinusoidal waveform $S_{V1}$ (as shown in FIG. 5). The sinusoidal waveform $S_{V1}$ continuously "rings" or repeats at a ringing period $P_{RING}$ since the circuit of FIG. 4 is presumed to be ideal, and without internal resistance.

Again referring to FIG. 4, it is now assumed that the second switch $S_2$ is moved in the direction indicated by the arrow at time $T_1$ to connect the first and second voltage sources $V_1$ and $V_2$ in series. At time $T_1$ a second component waveform $S_{V2}$ (generally illustrated in dashed lines) is output at $V_{OUT}$ in response to the second step input voltage $V_2$. The second sinusoidal or "ringing" waveform $S_{V2}$ is offset in time from the first sinusoidal signal $S_{V1}$ by a time differential $T_1-T_0$. This time differential is selected to be half of the ring period of the LC circuit.

The resultant or composite output signal $S_{OUT}$ (FIG. 4) may be calculated based on superposition of the first and second waveforms $S_{V1}$ and $S_{V2}$ since the circuit of FIG. 4 is linear, and, thus, obeys the laws of superposition. According to the principle of superposition, the output response at any particular time in a linear circuit in which more than one independent source is applied may be obtained by summing the responses caused by each independent source acting alone at the particular time. As illustrated, the resultant signal $S_{OUT}$ includes a smooth transition region and maintains a constant voltage after time T1.

Figure 6:
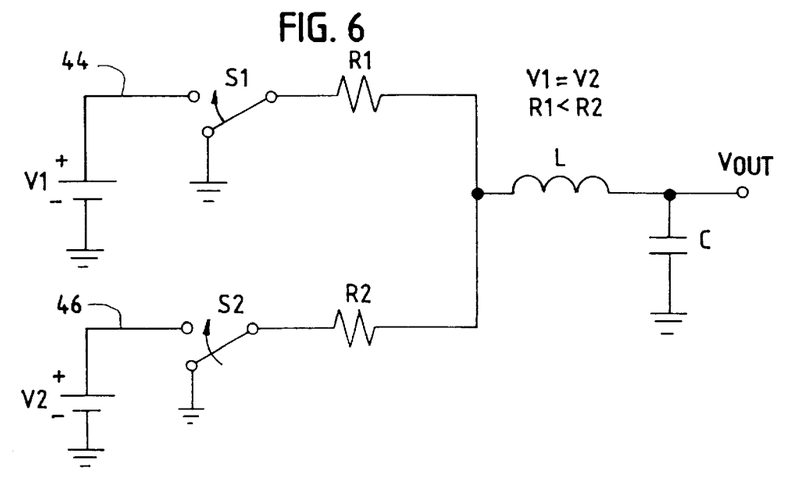
FIG. 6 is a schematic diagram of non-ideal LC circuit which experiences damping circuit used to illustrate some of the principles upon which the present invention is based.
Figure 7:
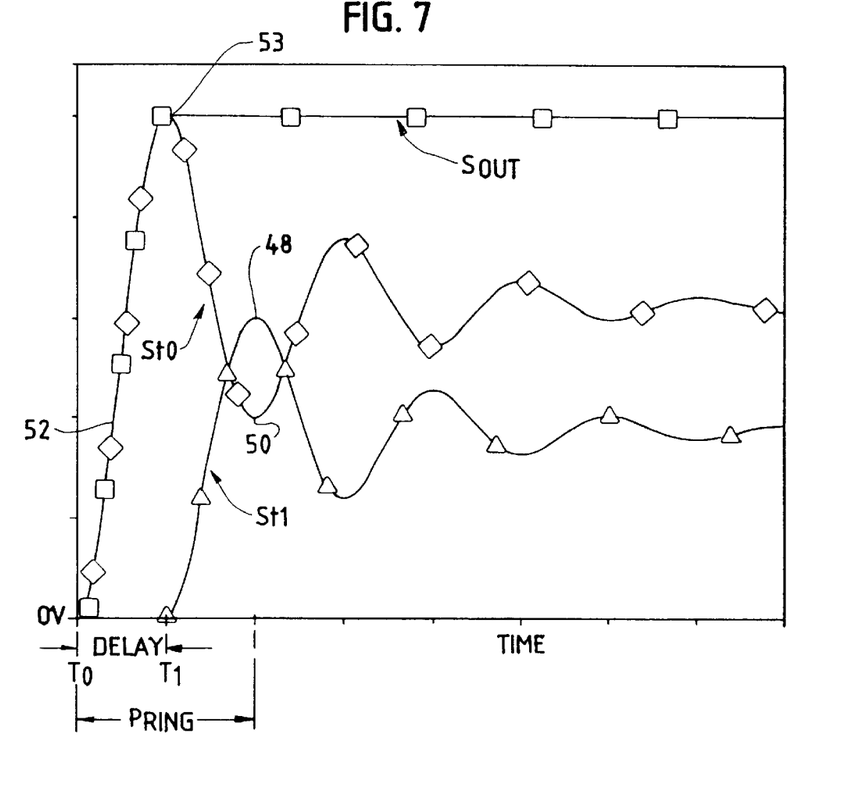
FIG. 7 illustrates component waveforms and a resultant composite signal generated by the non-ideal circuit of FIG. 6.

In the circuit of FIG. 6, input pulses are applied at times $T_0$ and $T_1$ to input lines 44 and 46 through resistors $R_1$ and $R_2$ and therefrom to the LC circuit. The circuit thus exhibits a damped response. FIG. 7 illustrates the signal response of the circuit of FIG. 6. The pulse introduced at time $T_0$ is acted to upon by the RLC circuit to generate the signal waveform $S_{T0}$. Similarly, the pulse introduced at time $T_1$ is acted upon by the RLC circuit to generate a signal waveform $S_{T1}$. The circuit of FIG. 7, as noted, exhibits some damping, as evidenced in FIG. 7 by the reduction in amplitude of the first and second signal responses $S_{T0}$ and $S_{T1}$ over time. It is preferable to include damping in the circuit since the input pulses applied at lines 44 and 46 may differ. Without damping, a substantial output ripple error may accumulate over time.

The resistors $R_1$ and $R_2$ may be adjusted to coordinate, as closely as possible, the amplitudes of the first and second signal response waveforms. By way of example only, the resistors $R_1$ and $R_2$ may be set such that the amplitude at the peak 48 (FIG. 7) of the second signal waveform $S_{T1}$ adds to (i.e., combines with) the amplitude at the valley 50 of the first signal $S_{T0}$ to maintain a generally constant output equal to the first peak 53 of the first signal $S_{T0}$. By way of example only, if one volt step functions are applied to leads 44 and 46, the resistors $R_1$ and $R_2$ may be set to 0.513 ohms and 0.855 ohms while L may be a 0.314 H inductor and C may be a 0.314 F capacitor.

Figure 8:
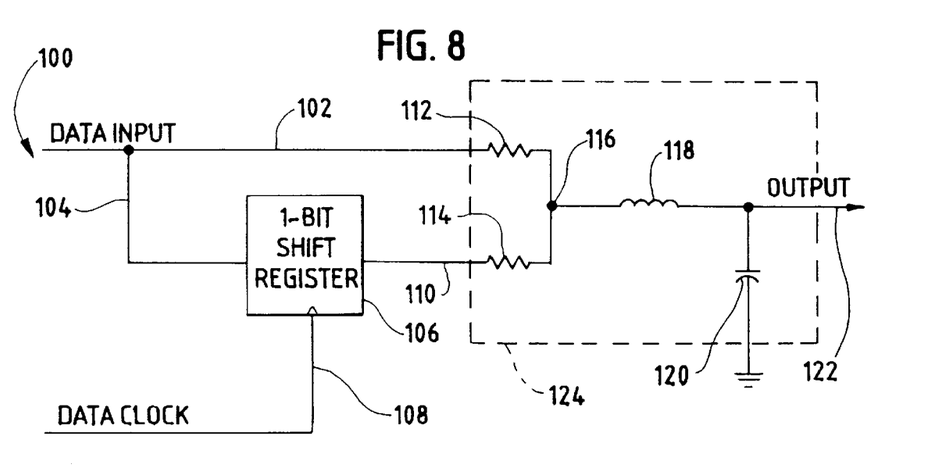
FIG. 8 illustrates a schematic diagram of a first embodiment of the present invention.

Turning to FIGS. 8 and 9A–9G, a first embodiment of the present invention is described and illustrated. FIG. 8 illustrates a pulse shaping circuit (generally denoted by the reference numeral 100). The pulse shaping circuit includes an input lead 102 which receives a stream of data bits that, for example, carry information using a binary NRZ data format (although multiple level signals having more than two states may also be applied). A tap line 104 connects the input lead 102 with a delay circuit 106. The signals of both the delay circuit 106 and the input lead 102 are provided (either directly or through one or more buffers) to a ringing filter circuit 124 that is specifically designed to have a ringing characteristic with a predetermined ringing period. The ringing period of the ringing filter circuit 124 is selected to be less than or about equal to two symbol periods of the data stream provided at the data input of the circuit 100. Preferably, the ringing period is equal to about two symbol periods. In some instances, it may be desirable to select the ringing period to be about one symbol period in duration.

By way of example only, the delay circuit 106 may represent a one bit shift register which shifts data pulses therethrough based on a data clock signal applied upon line 108. The delay circuit 106 receives and stores each data bit entered upon the input lead 102 for a predetermined propagation delay. The propagation delay of the delay circuit 106 is preferably about equal to half of the ringing period of the ringing filter circuit. In an even more preferable embodiment, the propagation delay is equal to about one symbol period. The delay module 106 outputs a stream of delayed data symbols upon line 110. In the illustrated embodiment, the clock signal supplied to the shift register would have a clock period equal to the propagation delay. If an N-bit shift register were used, the clock signal would have a period equal to the propagation delay divided by N.

Figure 9A:
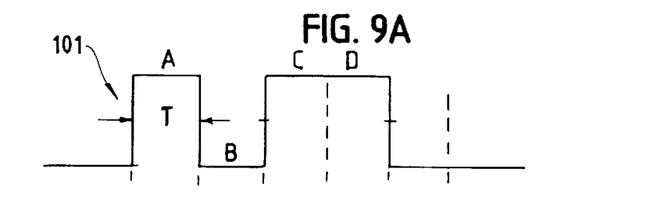
FIGS. 9A–9G illustrate signal responses produced by the circuit illustrated a the schematic diagram of FIG. 8.
Figure 9B:
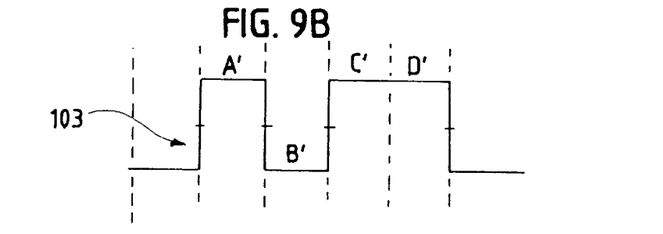
Figure 9C:
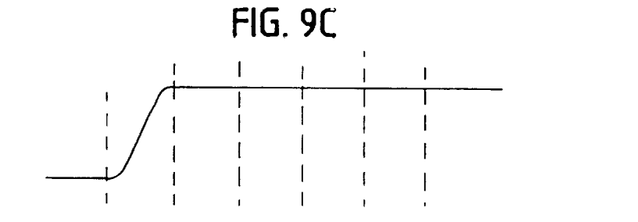
Figure 9D:
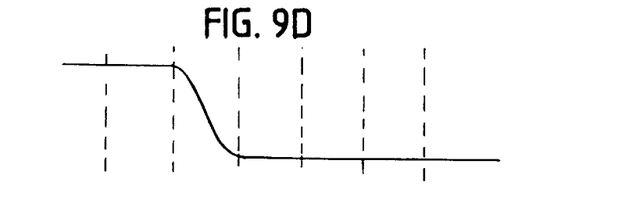
Figure 9E:
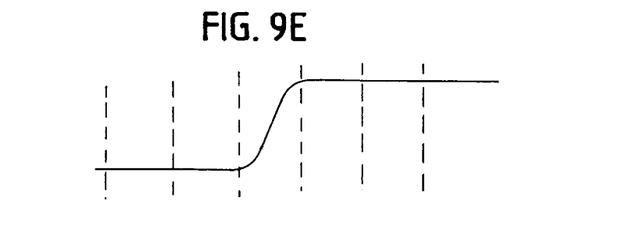
Figure 9F:
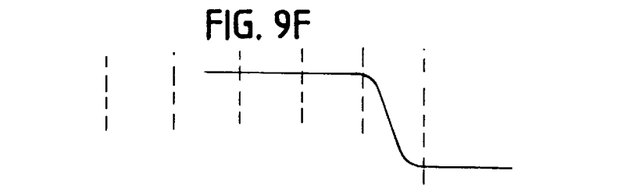
Figure 9G:
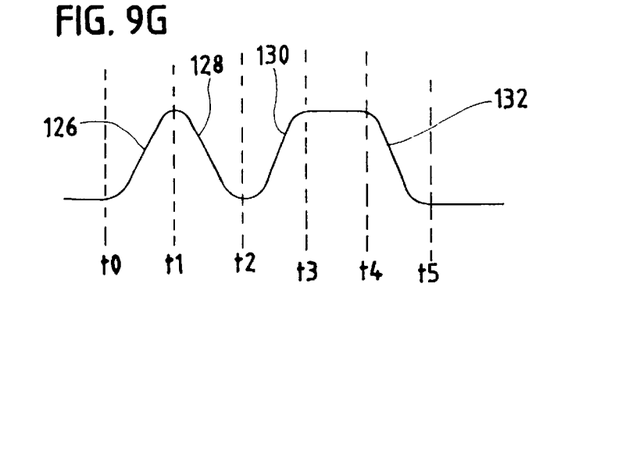

FIG. 9A illustrates an exemplary stream of data symbols 101 labeled as symbols A through D. An exemplary delayed data stream 103 is illustrated in FIG. 9B, in which each data symbol (A'–D') follows a corresponding data symbol (A–D) in the original input data stream 101 by a time T equal to the propagation delay. The original and delayed data streams are supplied to the ringing filter circuit 124. More particularly, in the present embodiment, the original and delayed symbol streams are supplied through resistors 112 and 114 to a common node 116 and to an inductor 118 and capacitor 120 that are arranged in a low-pass configuration. The resistors 112 and 114, the inductor 118 and the capacitor 120 cooperate to define the ringing filter circuit 124 that combines the symbol streams received upon lines 102 and 110 to produce a converted output data stream at line 122.

With reference again to the principles described in connection with FIGS. 4–8, the response of the ringing filter can be understood. To this end, the individual responses of the ringing filter circuit 124 to pulses A–D are illustrated in FIGS. 9C–9F, respectively. These signals are combined in the ringing filter circuit 124 to generate resultant composite waveform illustrated in FIG. 9G. As illustrated, the composite waveform includes transition regions 126, 128, 130, 132 and the like, which have a substantially sinusoidal shape. As such, the resulting waveform has a substantially reduced bandwidth when compared to the bandwidth of the input data stream of FIG. 9A. Additionally, the resulting waveform has no intersymbol interference associated with it. Preferably, the resulting waveform is acquired at times corresponding to $t_1$, $t_2$, $t_3$, etc. by any receiver to which the data is supplied.

Figure 10:
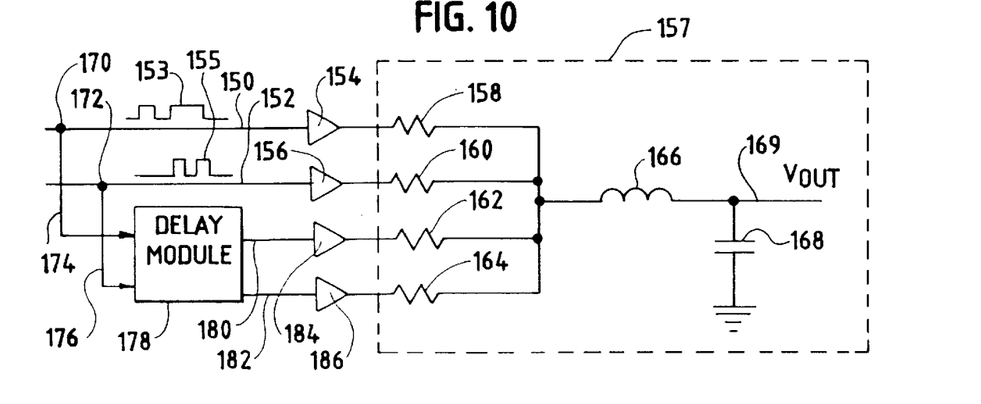
FIG. 10 illustrates a schematic diagram of an embodiment of the present invention for providing a multi-level, non-binary output signal.
Figure 11A:
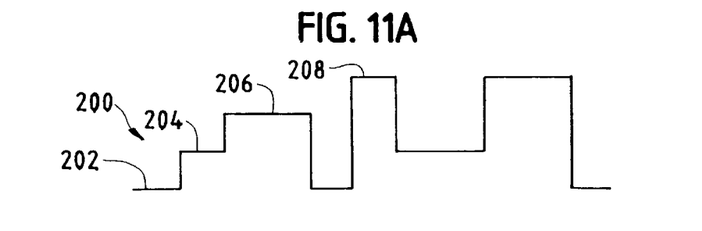
FIGS. 11A and 11B illustrate input and output signals associated with the circuit of FIG. 10.
Figure 11B:
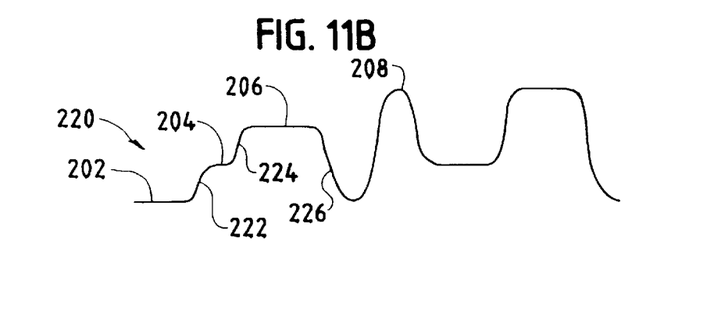

FIGS. 10, 11A and 11B illustrate an alternative embodiment of the present invention. In the embodiment of FIG. 10, the shaping and filtering circuit has been modified for use in a transmission system which supports a multi-level data signal output stream having more than two potential logic levels. In the embodiment of FIG. 10, four logical levels are available through the use of two main input leads 150 and 152, each of which may receive a stream of binary data symbols 153 and 155 (although the input data stream may itself be a multilevel, non-binary stream). The symbols within the data streams 153 and 155 are aligned in time to define one of four logic levels. For example, when leads 150 and 152 both receive 0-state bits, they define a logic level zero. When leads 150 and 152 receive a 0-state bit and a 1-state bit, respectively, they define a logic level one. When leads 150 and 152 receive a 1-state bit and a 0-state bit, they define a logic level two, and when leads 150 and 152 both receive 1-state bits, they define a logic level three. The data streams 153 and 155 are passed through buffers 154 and 156 to a ringing filter circuit 157 which may include resistors 158, 160, 162 and 164, inductor 166 and capacitor 158. The ringing filter circuit 157 has a ringing period such as described above.

The input leads 150 and 152 are connected at nodes 170 and 172 with tap lines 174 and 176 to deliver the incoming streams of data symbols 153 and 155 to a delay module 178. The delay module 178 outputs data bit values upon leads 180 and 182 which are received upon incoming tap lines 174 and 176, respectively, after a predefined delay (such as explained above in connection with the embodiment of FIG. 8). The delayed data bit streams are passed along lines 180 and 182 through buffers 184 and 186 to the ringing filter circuit 157 via resistors 162 and 164. By way of example only, the delay module may include two one-bit shift registers aligned in parallel to receive separately data symbols incoming from lines 174 and 176 and output same in parallel to lines 180 and 182. Other configurations are likewise suitable, such as described above.

The values of resistors 158, 160, 162 and 164 may be defined in a predetermined relationship to one another. Optionally, resistors 158 and 162 may be defined as a function of resistors 160 and 164, respectively. By way of example only, resistor 158 may equal ½ the value of resistor 160, while resistor 162 may equal ½ the value of resistor 164. Resistors 158 and 160 may be set with respect to resistors 162 and 164, to minimize ripple errors.

Turning to FIGS. 11A and 11B, FIG. 11A illustrates an exemplary digital signal defined by the binary data bit streams 153 and 155. The digital signal of FIG. 11A includes four discrete logic levels 202, 204, 206 and 208, each of which is defined by a unique bit combination received upon the leads 150 and 152. In FIG. 10, as data bit values are supplied via leads 150, 152, 180 and 182 to the ringing filter circuit 157, each data pulse introduces a corresponding component waveform response into the resultant signal on output lead 169. Resistors 158, 160, 162 and 164 are assigned values as explained above in order to ensure proper attention therebetween of the associated component waveform responses. It will be recognized that the logic levels need not be equally spaced.

The ringing filter circuit 157 outputs a resultant or composite signal on line 169 (FIG. 10) which resembles the signal illustrated in FIG. 11B in response to the signal illustrated in FIG. 11A. Within the resultant signal 220, transition regions between logic levels are shaped to be substantially sinusoidal (see transition regions 222, 224, 226 and the like).

In the foregoing embodiments, the transition regions between logic levels may occupy a complete clock cycle corresponding to the width of a data bit pulse. However, the transitions need not be so slow. Instead, the propagation of the delay module may be adjusted in order that the transitions occur in a shorter period of time in which case the transitions may be less smooth.

Figure 12:
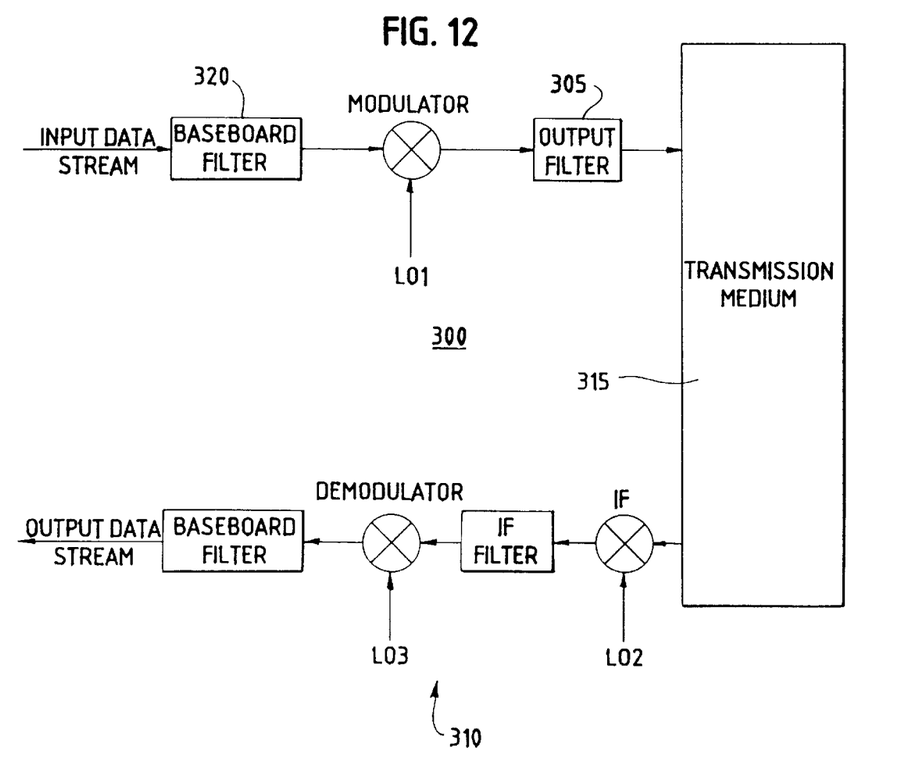
FIG. 12 is a schematic diagram of a basic RF communications system that may employ the present invention.

FIG. 12 illustrates a system in which the foregoing pulse shaping circuits may be used. More particularly, the system, shown generally at 300, is basic RF digital communications system comprising a transmitter 305 and receiver 310 that respectively transmit and receive data over a transmission medium 315, such as air, cable, etc. The pulse shaping circuits described herein may be incorporated in the baseband filter 320 of the receiver 310.

While particular elements, embodiments and applications of the present invention have been shown and described, it will be understood, of course, that the invention is not limited thereto since modifications may be made bar those skilled in the art, particularly in light of the foregoing teachings. It is therefore contemplated by the appended claims to cover such modifications as incorporate those features which come within the spirit and scope of the invention.

What is claimed is:

1. A signal shaping circuit for shaping amplitude shift keyed digital pulses of a plurality of digital data streams each comprised of a plurality of symbols, each symbol having a symbol period, the signal shaping circuit generating an output signal amplitude having a smooth transition region between logic level transitions of an output digital data stream generated from the plurality of digital data streams, said circuit comprising:

plurality of input leads each receiving data pulses from a respective one of the plurality of digital data streams;

delay circuit having a predefined time delay comprising a plurality of input lines, each input line receiving data pulses from a respective one of the plurality of digital data streams and, after a predefined time delay, outputting delayed digital pulses corresponding to each of the digital pulses received at the input leads on respective corresponding output lines;

ringing filter circuit having a linear response, the ringing filter circuit receiving each of the digital pulses provided at the input leads and each of the digital pulses provided at the outputs of the delay circuit, the ringing filter circuit having a ringing period about equal to or less than twice the symbol period of the symbols of the digital data streams, said predefined delay of the delay circuit being about equal to half of the ringing period, the ringing filter circuit generating an output amplitude shift keyed digital data stream directly corresponding to the digital data streams provided at the input leads wherein the output digital data stream has smooth transition regions between logic level transitions thereof.

2. The signal shaping circuit as claimed in claim 1 wherein the delay circuit comprises a shift register.

3. The signal shaping circuit as claimed in claim 1 wherein the ringing period is about equal to the twice symbol period.

4. The signal shaping circuit as claimed in claim 1 wherein the ringing period is about equal to the symbol period.

5. The signal shaping circuit as claimed in claim 1 wherein the digital data stream is in a binary format.

6. The signal shaping circuit as claimed in claim 1 wherein the ringing filter circuit comprises:

a first resistor;

a second resistor;

an inductor;

a capacitor;

the first resistor connected to receive the digital data stream from the input lead, the second resistor connected to receive the delayed digital pulses from the delay circuit, the inductor having a first lead connected at a common node with the first and second resistors and a second lead connected to the output of the ringing filter circuit, the capacitor being connected in a non-series circuit branch extending from the output of the ringing filter circuit.

7. The signal shaping circuit as claimed in claim 6 wherein the capacitor is connected between the output of the ringing filter circuit and circuit ground.

8. The signal shaping circuit as claimed in claim 1 wherein the output digital data stream comprises N levels wherein N>2.

9. The signal shaping circuit as claimed in claim 1 wherein each of the plurality of digital data streams is a binary data stream.

10. The signal shaping circuit as claimed in claim 1 wherein the ringing filter circuit comprises:

a first plurality of resistors each having a first lead connected to receive pulses from and respectively associated with each output of the delay circuit, each of the first plurality of resistors having a respective second lead;

a second plurality of resistors each having a first lead connected to receive pulses from and respectively associated with each input lead, each of the second plurality of resistors having a respective second lead;

each of the second leads of the first and second plurality of resistors being connected to a common node input to an inductor and capacitor connected in a low-pass filter configuration.

\* \* \* \* \*